United States Patent
Peng et al.

(10) Patent No.: US 10,541,276 B2
(45) Date of Patent: Jan. 21, 2020

(54) DOUBLE-SIDED ORGANIC LIGHT-EMITTING DIODE LIGHTING PANEL

(71) Applicant: Shenzhen China Star Optoelectronics Technology Co., Ltd., Shenzhen, Guangdong (CN)

(72) Inventors: Qiming Peng, Guangdong (CN); Xianjie Li, Guangdong (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 116 days.

(21) Appl. No.: 15/500,302

(22) PCT Filed: Jan. 22, 2017

(86) PCT No.: PCT/CN2017/072106
§ 371 (c)(1),
(2) Date: Jan. 31, 2017

(87) PCT Pub. No.: WO2018/040499
PCT Pub. Date: Mar. 8, 2018

(65) Prior Publication Data
US 2019/0006433 A1    Jan. 3, 2019

(30) Foreign Application Priority Data
Aug. 31, 2016  (CN) .......................... 2016 1 0799496

(51) Int. Cl.
*H01L 27/32*   (2006.01)
*H01L 51/50*   (2006.01)
(Continued)

(52) U.S. Cl.
CPC ...... *H01L 27/3209* (2013.01); *H01L 51/5044* (2013.01); *H01L 51/524* (2013.01);
(Continued)

(58) Field of Classification Search
CPC ............. H01L 27/3209; H01L 51/5253; H01L 51/5206; H01L 51/5259; H01L 51/5234;
(Continued)

(56) References Cited

U.S. PATENT DOCUMENTS

2007/0164660 A1\* 7/2007 Hu et al. ............. H01L 27/3267
313/500
2010/0308353 A1 12/2010 Grabowski et al.
(Continued)

FOREIGN PATENT DOCUMENTS

CN   101710610 A   5/2010
CN   104124389 A   10/2014
(Continued)

OTHER PUBLICATIONS

International Search Report and Written Opinion for International Application No. PCT/CN2017/072106, dated May 31, 2017.
(Continued)

*Primary Examiner* — Thinh T Nguyen

(57) ABSTRACT

Disclosed is a double-sided organic light-emitting diode lighting panel. A semitransparent silver film layer is provided between a first light-emitting layer that emits blue light and a second light-emitting layer that emits yellow light. Double-sided light emission of the OLED lighting panel is realized by taking advantage of semi-transparence and reflection properties of the silver film layer. Such a structure is relatively simple, and manufacture costs and manufacture difficulties are reduced. The OLED lighting panel can be used for interior lighting or can be used in (Continued)

places having special needs, and thus application of a double-sided OLED lighting device is widened.

10 Claims, 2 Drawing Sheets

(51) Int. Cl.
*H01L 51/52* (2006.01)
*H01L 51/00* (2006.01)

(52) U.S. Cl.
CPC ...... *H01L 51/5206* (2013.01); *H01L 51/5234* (2013.01); *H01L 51/5253* (2013.01); *H01L 51/5259* (2013.01); *H01L 51/5278* (2013.01); *H01L 51/005* (2013.01); *H01L 51/0054* (2013.01); *H01L 51/0059* (2013.01); *H01L 51/0072* (2013.01); *H01L 51/0081* (2013.01); *H01L 51/5012* (2013.01); *H01L 51/5016* (2013.01); *H01L 51/5056* (2013.01); *H01L 51/5072* (2013.01); *H01L 51/5088* (2013.01); *H01L 51/5092* (2013.01); *H01L 2251/301* (2013.01); *H01L 2251/308* (2013.01); *H01L 2251/5323* (2013.01); *H01L 2251/5361* (2013.01); *H01L 2251/558* (2013.01)

(58) Field of Classification Search
CPC ........... H01L 51/5012; H01L 2251/301; H01L 2251/558
USPC ..................... 257/40, 72, 79; 438/48, 82, 99
See application file for complete search history.

(56) References Cited

U.S. PATENT DOCUMENTS

| 2011/0095702 | A1* | 4/2011 | Lee et al. ............ H01L 27/3202 315/294 |
| 2012/0091923 | A1* | 4/2012 | Kastner-Jung et al. .................... H01L 51/504 315/360 |
| 2012/0181915 | A1* | 7/2012 | Yamamoto et al. ......................... H01L 51/5237 313/46 |
| 2015/0295200 | A1* | 10/2015 | Furukawa et al. .... H01L 51/524 257/40 |
| 2018/0040842 | A1* | 2/2018 | Wu ....... H01L 51/504 |

FOREIGN PATENT DOCUMENTS

| CN | 104854724 A | 8/2015 |
| CN | 105161510 A | 12/2015 |
| CN | 105161633 A | 12/2015 |
| CN | 105247960 A | 1/2016 |
| CN | 106129099 A | 11/2016 |
| WO | 2012075639 A1 | 6/2012 |

OTHER PUBLICATIONS

Chinese Office Action and Search Report for Chinese Patent Application No. 201610799496.2 dated Jun. 28, 2018.

* cited by examiner

DOUBLE-SIDED ORGANIC LIGHT-EMITTING DIODE LIGHTING PANEL

CROSS-REFERENCE TO RELATED APPLICATIONS

This application claims the priority of Chinese patent application CN 201610799496.2, entitled "Double-sided organic light-emitting diode lighting panel" and filed on Aug. 31, 2016, the entirety of which is incorporated herein by reference.

FIELD OF THE INVENTION

The present disclosure relates to the technical field of organic light-emitting diode lighting, and in particular, to a double-sided organic light-emitting diode lighting panel.

BACKGROUND OF THE INVENTION

Organic light emitting diodes (OLEDs) have features of simple structure, ultra-thinness, and low power consumption. At present, OLED display devices have become a very promising flat panel display technology, and have been well appreciated by display device manufacturers. A variety of display devices using OLED panels have appeared in the market currently. From smart phones having OLED screens of wide color gamut and high resolution to large-sized OLED televisions of high contrast and large viewing angle, display devices adopting OLED panels show better performance than display devices adopting liquid crystal panels.

Compared to application of OLEDs in panel display, application of OLEDs in lighting field is still at an early stage of development. At present, in the market, OLED lighting lamps are of high prices and limited styles, and are basically single-sided lighting devices.

Double-sided OLED lighting lambs are in developing. US patent US 2007/0126354A1 discloses a double-sided OLED device. In the OLED device, OLEDs are prepared on two transparent substrates, respectively, and then the two substrates are encapsulated separately and fitted together to achieve double-sided light emission. However, this solution requires two substrates and requires that each of the substrates be encapsulated, thus leading to high cost and complexity of the whole structure. Chinese patent CN 101952967A provides a different solution, in which two OLED light-emitting layers are prepared on one substrate, and a third electrode is prepared between the two OLED light-emitting layers to achieve separate control over the two OLED light-emitting layers and double-sided light emission. However, this solution requires a third electrode, which also results in a complicated structure in a display panel. Besides, to achieve double-sided white light, there is a relatively high requirement for structures of OLEDs.

Therefore, it is desirable to provide an improved double-sided OLED so as to achieve a double-sided white OLED lighting panel having a simple structure.

SUMMARY OF THE INVENTION

In view of disadvantages of the prior art, the present disclosure provides a double-sided OLED (organic light-emitting diode) lighting panel. A structure of the OLED lighting panel is simple. White light can be emitted from two sides of the OLED lighting panel. Besides, cool white light is emitted from a first side of the OLED lighting panel, and warm white light is emitted from a second side thereof. Thus, usage experience of an OLED lighting device is improved, and application of the OLED lighting device is widened.

The present provides a double-sided OLED lighting panel. In the OLED lighting panel, a semitransparent silver film layer is provided between a first light-emitting layer and a second light-emitting layer of a double-layer OLED.

According to the present disclosure, when the first light-emitting layer emits blue light, the second light-emitting layer emits yellow light, whereas when the first light-emitting layer emits yellow light, the second light-emitting layer emits blue light.

In the present disclosure, the OLED lighting panel comprises a substrate, an anode formed on the substrate, a hole injection layer formed on the anode, a first hole transport layer formed on the hole injection layer, a first light-emitting layer formed on the first hole transport layer, a first electron transport layer formed on the first light-emitting layer, an N-type charge generation layer formed on the first electron transport layer, a semitransparent silver film layer formed the N-type charge generation layer, a P-type charge generation layer formed on the semitransparent silver film layer, a second hole transport layer formed on the P-type charge generation layer, a second light-emitting layer formed on the second hole transport layer, a second electron transport layer formed on the second light-emitting layer, an electron injection layer formed on the second electron transport layer, a cathode formed on the electron injection layer, a cover plate arranged above the cathode and bonded with the substrate, and an encapsulation resin material used for encapsulating the substrate and the cover plate.

According to the present disclosure, the semitransparent silver film layer is made of silver and has a thickness in a range from 2 nm to 20 nm.

In some embodiments of the present disclosure, the light emitting layer that emits yellow light is made of an organic micromolecule fluorescent material, a polymer fluorescent material, a micromolecule phosphorescent material, or a polymer phosphorescent material of a host-guest doped form or an undoped form, and has a thickness in a range from 5 nm to 50 nm.

In some other embodiments of the present disclosure, the light emitting layer that emits blue light is made of an organic micromolecule fluorescent material, a polymer fluorescent material, a micromolecule phosphorescent material, or a polymer phosphorescent material of a host-guest doped form or an undoped form, and has a thickness in a range from 5 nm to 50 nm.

According to the present disclosure, the substrate is a transparent glass substrate or a transparent flexible substrate, and the cover plate is a transparent glass cover plate or a transparent flexible cover plate.

According to the present disclosure, the anode is made of a transparent conductive metal oxide and has a thickness in a range from 20 nm to 200 nm. In some embodiments of the present disclosure, the anode is made of indium tin oxide or indium zinc oxide.

According to the present disclosure, the cathode is made of a transparent conductive metal oxide and has a thickness in a range from 20 nm to 200 nm. In some embodiments of the present disclosure, the cathode is made of indium zinc oxide.

According to the present disclosure, the hole injection layer is made of an organic micromolecule hole injection material, a polymer hole injection material, or a metal oxide hole injection material, and has a thickness in a range from 1 nm to 100 nm.

In some embodiment of the present disclosure, the organic micromolecule hole injection material is HATCN; the polymer hole injection material is PEDOT:PSS (poly(3,4-ethylenedioxythiophene) polystyrene sulfonate); and the metal oxide hole injection material is $MoO_3$ (molybdenum trioxide).

According to the present disclosure, the electron injection layer is made of one or more of materials selected from the group consisting of a metal complex, an alkali metal, an alkali metal salt, an alkaline earth metal, and an alkaline earth metal salt, and has a thickness in a range from 0.5 nm to 10 nm.

In some embodiments of the present disclosure, the metal complex is 8-Hydroxyquinolinolato-lithium; the alkali metal is Li, Na, K, Rb, or Cs; the alkali metal salt is LiF, $Li_2CO_3$, LiCl, NaF, $Na_2CO_3$, NaCl, CsF, $Cs_2CO_3$, or CsCl; the alkaline earth metal is Mg, Ca, Sr, or Ba; and the alkaline earth metal salt is $CaF_2$, $CaCO_3$, $SrF_2$, $SrCO_3$, $BaF_2$, or $BaCO_3$.

According to the present disclosure, the first hole transport layer and the second hole transport layer both are made of an organic micromolecule hole transport material or a polymer hole transport material, and have a thickness in a range from 10 nm to 100 nm.

In some embodiments of the present disclosure, the organic micromolecule hole transport material is NBP (N,N'-Bis-(1-naphthalenyl)-N,N'-bis-phenyl-(1,1'-biphenyl)-4,4'-diamine) or TAPC (4,4'-yclohexylidenebis[N,N-bis(p-tolyl)aniline]), and the polymer hole transport material is Poly-TPD (Poly[bis(4-phenyl)(4-butylphenyl)amine]).

According to the present disclosure, the first electron transport layer and the second electron transport layer both are made of a metal complex material or an imidazole electron transport material, and have a thickness in a range from 10 nm to 100 nm.

In some embodiments of the present disclosure, the metal complex material is $Alq^3$ (Aluminum Tris(8-Hydroxyquinolinate)), and the imidazole electron transport material is TPBi (1,3,5-Tris(1-phenyl-1H-benzimidazol-2-yl)benzene).

According to the present disclosure, the N-type charge generation layer is made of an electron transport material doped with a low work function metal material. A doping mass ratio between the electron transport material and the low work function metal material is 1:(0.001-0.003). The N-type charge generation layer has a thickness in a range from 5 nm to 30 nm.

In some embodiments of the present disclosure, the low work function metal material is Li or Mg.

According to the present disclosure, the P-type charge generation layer is made of a hole injection material or a hole injection material doped with a hole transport material, and has a thickness in a range from 5 nm to 30 nm.

According to the present disclosure, the encapsulation resin material includes an epoxy resin adhesive or molten glass powder.

In the present disclosure, the OLED lighting panel further comprises a desiccant layer filled between the cover plate and the substrate.

BRIEF DESCRIPTION OF THE DRAWINGS

The present disclosure will be explained hereinafter with reference accompanying drawings, in which.

DETAILED DESCRIPTION OF THE EMBODIMENTS

The present disclosure will be explained in detail hereinafter, so that it can be understood easily.

As mentioned above, existing double-sided OLED (Organic Light-emitting Diode) lighting devices are complicated in structure, which limits application of double-sided OLED lighting devices.

The inventor found that double-sided light emission of an OLED lighting panel can be realized by taking advantage of semi-transparence and reflection properties of a silver film layer. A structure to realize this is relatively simple and easy to manufacture, and application of a double-sided OLED lighting device can thus be widened. The present disclosure, for the first time, provides a semitransparent silver film layer between a first light-emitting layer and a second light-emitting layer of a double-layer OLED in order to realize double-sided light emission of the OLED lighting panel. The present disclosure is based on the above method.

Therefore, a double-sided OLED lighting panel of the present disclosure is realized by providing a semitransparent silver film layer between a first light-emitting layer and a second light-emitting layer of a double-layer OLED and taking advantage of semi-transparence and reflection properties of the silver film layer.

According to some embodiments of the present disclosure, when the first light-emitting layer emits blue light, the second light-emitting layer emits yellow light, whereas when the first light-emitting layer emits yellow light, the second light-emitting layer emits blue light. Thus, white light with different color temperatures is emitted from two sides of the OLED lighting panel. That is, cool white light is emitted from a first side of the OLED lighting panel, and warm white light is emitted from a second side thereof.

Figure 1:
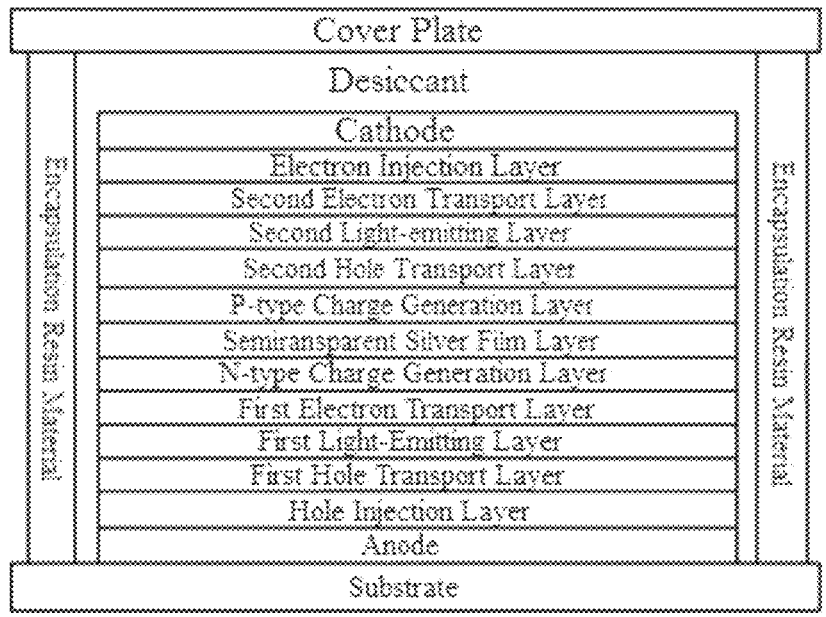
FIG. 1 schematically shows a structure of a double-sided OLED lighting panel.

In some specific embodiments of the present disclosure, a structure of the OLED lighting panel is shown in FIG. 1. It can be seen from FIG. 1 that the OLED lighting panel comprises a substrate, an anode, a hole injection layer, a first hole transport layer, a first light-emitting layer, a first electron transport layer, an N-type charge generation layer, a semitransparent silver film layer, a P-type charge generation layer, a second hole transport layer, a second light-emitting layer, a second electron transport layer, an electron injection layer, a cathode, a cover plate, and an encapsulation resin material. The substrate is a starting layer. The anode is formed on the substrate. The hole injection layer is formed on the anode. The first hole transport layer is formed on the hole injection layer. The first light-emitting layer is formed on the first hole transport layer. The first electron transport layer is formed on the first light-emitting layer. The N-type charge generation layer is formed on the first electron transport layer. The semitransparent silver film layer is formed the N-type charge generation layer. The P-type charge generation layer is formed on the semitransparent silver film layer. The second hole transport layer is formed on the P-type charge generation layer. The second light-emitting layer is formed on the second hole transport layer. The second electron transport layer is formed on the second light-emitting layer. The electron injection layer is formed on the second electron transport layer. The cathode is formed on the electron injection layer. The cover plate is arranged above the cathode and is bonded with the substrate. The encapsulation resin material is used for encapsulating the substrate and the cover plate.

In some preferred embodiments of the present disclosure, the OLED lighting panel further comprises a desiccant layer filled between the cover plate and the substrate, thereby further improving an encapsulation effect.

According to the present disclosure, the semitransparent silver film layer is made of silver and has a thickness in a range from 2 nm to 20 nm.

In some embodiments of the present disclosure, the light emitting layer that emits yellow light is made of an organic micromolecule fluorescent material, a polymer fluorescent material, a micromolecule phosphorescent material, or a polymer phosphorescent material of a host-guest doped form or an undoped form, and has a thickness in a range from 5 nm to 50 nm.

In some other embodiments of the present disclosure, the light emitting layer that emits blue light is made of an organic micromolecule fluorescent material, a polymer fluorescent material, a micromolecule phosphorescent material, or a polymer phosphorescent material of a host-guest doped form or an undoped form, and a thickness of the light emitting layer is in a range from 5 nm to 50 nm.

According to the present disclosure, the substrate is a transparent glass substrate or a transparent flexible substrate, and the cover plate is a transparent glass cover plate or a transparent flexible cover plate.

According to the present disclosure, the anode is made of a transparent conductive metal oxide and has a thickness in a range from 20 nm to 200 nm. In some embodiments of the present disclosure, the anode is made of ITO (Indium Tin Oxide) or IZO (Indium Zinc Oxide).

According to the present disclosure, the cathode is made of a transparent conductive metal oxide and has a thickness in a range from 20 nm to 200 nm. In some embodiments of the present disclosure, the cathode is made of IZO (Indium Zinc Oxide).

According to the present disclosure, the hole injection layer is made of an organic micromolecule hole injection material, a polymer hole injection material, or a metal oxide hole injection material, and has a thickness in a range from 1 nm to 100 nm.

In some embodiments of the present disclosure, the organic micromolecule hole injection material is HATCN (Dipyrazino[2,3-f:2',3'-h]quinoxaline-2,3,6,7,10,11-hexacarbonitrile); the polymer hole injection material is PEDOT:PSS (poly(3,4-ethylenedioxythiophene) polystyrene sulfonate); and the metal oxide hole injection material is $MoO_3$ (molybdenum trioxide).

According to the present disclosure, the electron injection layer is made of one or more materials selected from a group consisting of a metal complex, an alkali metal, an alkali metal salt, an alkaline earth metal, or an alkaline earth metal salt, and has a thickness in a range from 0.5 nm to 10 nm.

In some embodiments of the present disclosure, the metal complex is 8-Hydroxyquinolinolato-lithium (Liq); the alkali metal is Li, Na, K, Rb, or Cs; the alkali metal salt is LiF, $Li_2CO_3$, LiCl, NaF, $Na_2CO_3$, NaCl, CsF, $Cs_2CO_3$, or CsCl; the alkaline earth metal is Mg, Ca, Sr, or Ba; and the alkaline earth metal salt is $CaF_2$, $CaCO_3$, $SrF_2$, $SrCO_3$, $BaF_2$, or $BaCO_3$.

According to the present disclosure, the first hole transport layer and the second hole transport layer both are made of an organic micromolecule hole transport material or a polymer hole transport material, and have a thickness in a range from 10 nm to 100 nm.

In some embodiments of the present disclosure, the organic micromolecule hole transport material is NBP (N,N'-Bis-(1-naphthalenyl)-N,N'-bis-phenyl-(1,1'-biphenyl)-4,4'-diamine) or TAPC (4,4'-yclohexylidenebis[N,N-bis(p-tolyl)aniline]), and the polymer hole transport material is Poly-TPD (Poly[bis(4-phenyl)(4-butylphenyl)amine]).

According to the present disclosure, the first electron transport layer and the second electron transport layer both are made of a metal complex material or an imidazole electron transport material, and have a thickness in a range from 10 nm to 100 nm.

In some embodiments of the present disclosure, the metal complex material is $Alq^3$ (Aluminum Tris(8-Hydroxyquinolinate)), and the imidazole electron transport material is TPBi (1,3,5-Tris(1-phenyl-1H-benzimidazol-2-yl)benzene).

According to the present disclosure, the N-type charge generation layer is made of an electron transport material doped with a low work function metal material. A doping mass ratio between the electron transport material and the low work function metal material is 1:(0.001-0.003). The N-type charge generation layer has a thickness in a range from 5 nm to 30 nm.

In some embodiments of the present disclosure, the low work function metal material is Li or Mg.

According to the present disclosure, the P-type charge generation layer is made of a hole injection material or a hole injection material doped with a hole transport material, and the P-type charge generation layer has a thickness in a range from 5 nm to 30 nm.

According to the present disclosure, the encapsulation resin material includes, but is not limited to, an epoxy resin adhesive, molten glass powder, etc.

The present disclosure has beneficial effects as follows. In the present disclosure, a semitransparent silver film layer is provided between a first light-emitting layer that emits blue light and a second light-emitting layer that emits yellow light of a double-layer OLED. Double-sided light emission of an OLED lighting panel is realized by taking advantage of semi-transparence and reflection properties of the silver film layer. Such a structure is relatively simple, and manufacture costs and manufacture complexity are reduced.

White light with different color temperatures is emitted from two sides of the OLED lighting panel. That is, cool white light is emitted from a first side of the OLED lighting panel, and warm white light is emitted from a second side of the OLED lighting panel. Thus, usage experience of an OLED lighting device is improved. The OLED lighting panel can be used for interior lighting or can be used in places having special needs, and thus application of a double-sided OLED lighting device is widened.

EMBODIMENT

The present disclosure will be explained further with reference to accompanying drawings and embodiments, so that the present disclosure can be understood more easily. These embodiments are only for explaining the present disclosure, rather than restricting the application scope thereof. Materials and components used in the present disclosure are commercially available or may be obtained according to conventional methods.

Embodiment 1

Figure 2:
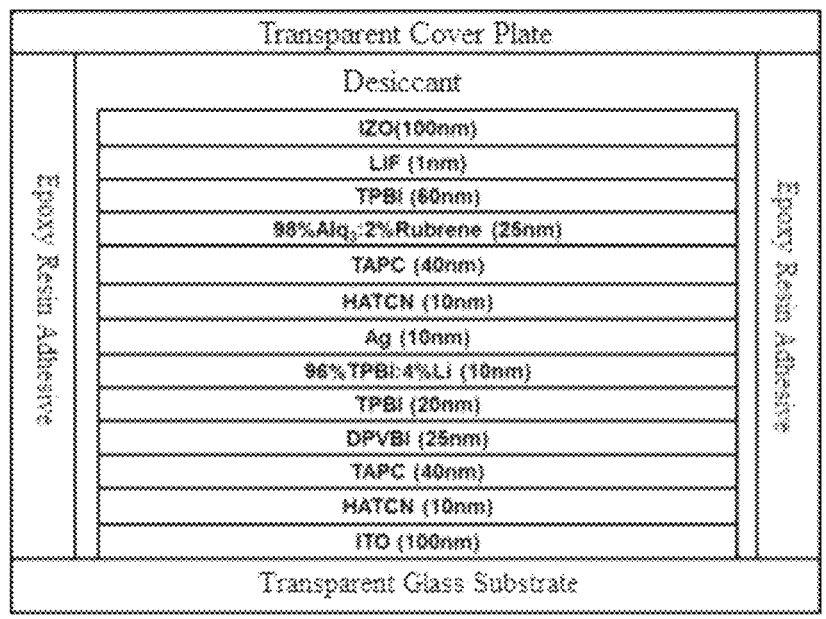
FIG. 2 schematically shows a structure of the double-sided OLED lighting panel in embodiment 1.

FIG. 2 schematically shows a structure of a double-sided OLED lighting panel of the present embodiment. Abbreviations, English names, and preparation methods of materials of layers of the OLED lighting panel are shown in Table 1.

TABLE 1

Abbreviations, English names, and preparation methods of materials of layers of the OLED lighting panel

Figure 3:
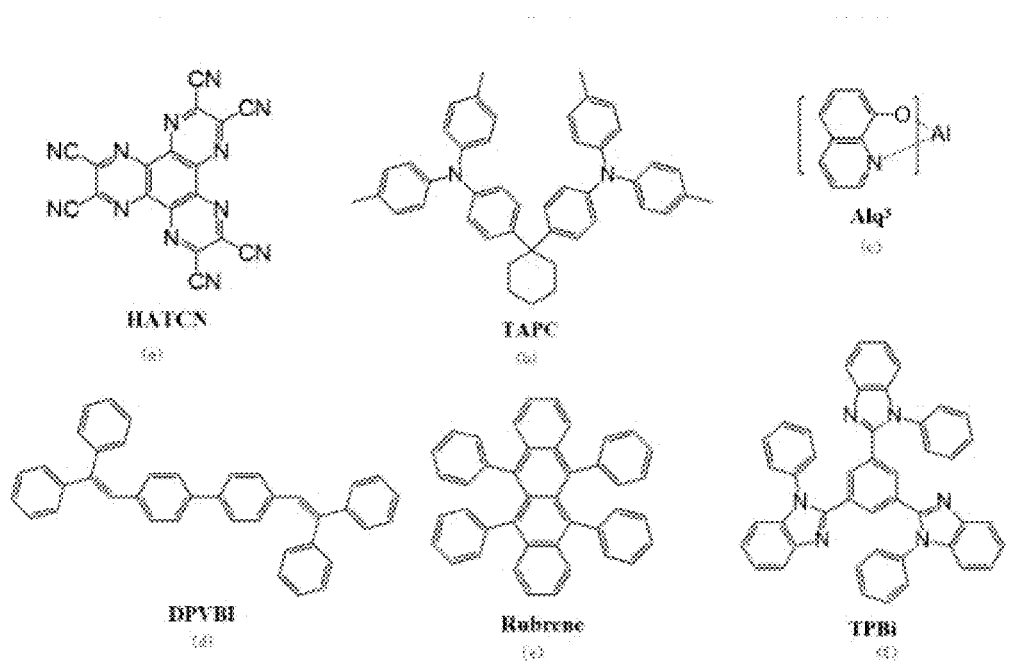
FIG. 3 shows structural formulas of organic molecules used in the double-sided OLED lighting panel in the embodiments.

|  | Abbreviation | English Name | Preparation Method |
|---|---|---|---|
| Anode | ITO | Indium Tin Oxide | Sputtering |
| Hole Injection Layer | HATCN (Structural Formula Shown in FIG. 3(a)) | Dipyrazino[2,3-f:2',3'-h]quinoxaline-2,3,6,7,10,11-hexacarbonitrile | Vacuum Evaporation |
| First Hole Transport Layer | TAPC (Structural Formula Shown in FIG. 3(b)) | 4,4'-yclohexylidenebis[N,N-bis(p-tolyl)aniline] | |
| First Light-emitting Layer (Blue Light) | DPVBI (Structural Formula Shown in FIG. 3(d)) | 4,4'-bis(2,2'-diphenyl vinyl)-1,1'-biphenyl | |
| First Electron Transport Layer | TPBi (Structural Formula Shown in FIG. 3(f)) | 1,3,5-Tris(1-phenyl-1H-benzimidazol-2-yl)benzene | |
| N-type Charge Generation Layer | 96% TPBi:4% Li | 96% 1,3,5,Tris(1-phenyl-1H-benzimidazol-2-yl)benzene:4% Lithium | |
| Semitransparent Silver Film Layer | Ag | Silver | |
| P-type Charge Generation Layer | HATCN | Dipyrazino[2,3-f:2',3'-h]quinoxaline-2,3,6,7,10,11-hexacarbonitrile | |
| Second Hole Transport Layer | TAPC | 4,4'-yclohexylidenebis[N,N-bis (p-tolyl)aniline] | |
| Second Light-emitting Layer (Yellow Light) | 98% Alq$^3$ (Structural Formula Shown in FIG. 3(c)):2% Rubrene (Structural Formula Shown in FIG. 3(e)) | 98% Aluminum Tris(8-Hydroxyquinolinate):2% Rubrene | |
| Second Electron Transport Layer | TPBi | 1,3,5-Tris(1-phenyl-1H-benzimidazol-2-yl)benzene | |
| Electron Injection Layer | LiF | Lithium Fluoride | |
| Cathode | IZO | Indium Zinc Oxide | Sputtering |

Figure 4:
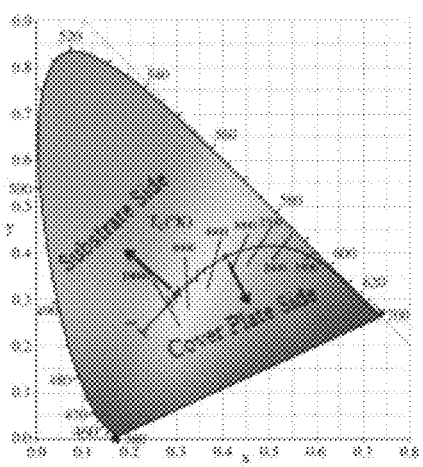
FIG. 4 shows a CIE chromaticity diagram of white light emitted from a substrate side and a cover plate side of the double-sided OLED lighting panel in the embodiments.

The first light-emitting layer of the OLED lighting panel emits blue light, and the second light-emitting layer thereof emits yellow light. A CIE chromaticity diagram of the OLED lighting panel is shown as FIG. 4. FIG. 2 shows CIE coordinate values and color temperatures of white light emitted from a substrate side and a cover plate side. A schematic diagram is shown as FIG. 4.

TABLE 2

CIE coordinate values and color temperatures of white light emitted from a substrate side and a cover plate side

|  | CIEx | CIEy | Color Temperature |
|---|---|---|---|
| Substrate Side (Cool white light) | 0.302 | 0.312 | 7500 K |
| Cover Plate Side (Warm white light) | 0.404 | 0.393 | 3500 K |

The above embodiments are described only for interpreting, rather than restricting, the present disclosure. The present disclosure is described with reference to specific embodiments, but it should be noted that words used therein are explanatory words rather than definitive ones. Amendments can be made to the present disclosure within the scope of the claims of the present disclosure according to regulation. Also, amendments can be made without departing from the scope and spirit of the present disclosure. Although the present disclosure described herein relates to specific methods, materials, and embodiments, it is not intended that the present disclosure be limited to the specific embodiments disclosed herein. On the contrary, the present disclosure can be extended to all other methods and applications having same functions.

The invention claimed is:

1. A double-sided organic light-emitting diode lighting panel comprising a substrate, an anode, a hole injection layer, a first hole transport layer, a first light-emitting layer, a first electron transport layer, an N-type charge generation layer, a semitransparent silver film layer, a P-type charge generation layer, a second hole transport layer, a second light-emitting layer, a second electron transport layer, an electron injection layer and a cathode stacked together in sequence and further comprising a cover plate and an encapsulation resin material;
wherein the N-type charge generation layer is arranged on a side of the semitransparent silver film layer close to the anode and contacted with the side of the semitransparent silver film layer, the P-type charge generation layer is arranged on an opposite side of the semitransparent silver film layer close to the cathode and contacted with the opposite side of the semitransparent silver film layer.

2. The organic light-emitting diode lighting panel according to claim 1, wherein the light emitting layer that emits yellow light is made of an organic micromolecule fluorescent material, a polymer fluorescent material, a micromolecule phosphorescent material, or a polymer phosphorescent material of a host-guest doped form or an undoped form, and has a thickness in a range from 5 nm to 50 nm.

3. The organic light-emitting diode lighting panel according to claim 1, wherein the light emitting layer that emits blue light is made of an organic micromolecule fluorescent material, a polymer fluorescent material, a micromolecule phosphorescent material, or a polymer phosphorescent material of a host-guest doped form or an undoped form, and has a thickness in a range from 5 nm to 50 nm.

4. The organic light-emitting diode lighting panel according to claim 1, wherein the hole injection layer is made of an organic micromolecule hole injection material, a polymer hole injection material, or a metal oxide hole injection material, and has a thickness in a range from 1 nm to 100 nm.

5. The organic light-emitting diode lighting panel according to claim 1, wherein the electron injection layer is made of one or more materials selected from the group consisting of a metal complex, an alkali metal, an alkali metal salt, an alkaline earth metal, and an alkaline earth metal salt, and has a thickness in a range from 0.5 nm to 10 nm.

6. The organic light-emitting diode lighting panel according to claim 5, wherein the metal complex is 8-Hydroxyquinolinolato-lithium; the alkali metal is Li, Na, K, Rb, or Cs; the alkali metal salt is $Li_2CO_3$, LiCl, NaF, $Na_2CO_3$, NaCl, CsF, $Cs_2CO_3$, or CsCl; the alkaline earth metal is Mg, Ca, Sr, or Ba; and the alkaline earth metal salt is $CaF_2$, $CaCO_3$, $SrF_2$, $SrCO_3$, $BaF_2$, or $BaCO_3$.

7. The organic light-emitting diode lighting panel according to claim 1, wherein the first hole transport layer and the second hole transport layer both are made of an organic micromolecule hole transport material or a polymer hole transport material, and have a thickness in a range from 10 nm to 100 nm.

8. The organic light-emitting diode lighting panel according to claim 1, wherein:
the N-type charge generation layer is made of an electron transport material doped with a low work function metal material, wherein a doping mass ratio between the electron transport material and the low work function metal material is 1:(0.001-0.003), and
the N-type charge generation layer has a thickness in a range from 5 nm to 30 nm.

9. The organic light-emitting diode lighting panel according to claim 8, wherein the low work function metal material is Li or Mg.

10. The organic light-emitting diode lighting panel according to claim 1, further comprising a desiccant layer filled between the cover plate and the substrate.

* * * * *